United States Patent [19]

Ohkubo et al.

[11] 4,241,103
[45] Dec. 23, 1980

[54] METHOD OF MANUFACTURING AN INTEGRATED THERMAL PRINTING HEAD

[75] Inventors: Toshio Ohkubo; Hidehiko Katoh; Yuji Kajiwara, all of Tokyo, Japan

[73] Assignee: Nippon Electric Co., Ltd., Tokyo, Japan

[21] Appl. No.: 911,243

[22] Filed: May 31, 1978

[30] Foreign Application Priority Data

May 31, 1977 [JP] Japan ............................ 52-70965[U]
Nov. 15, 1977 [JP] Japan .......................... 52-153738[U]

[51] Int. Cl.³ ............................................ H05B 1/00
[52] U.S. Cl. .................................. 427/103; 29/611;
29/620; 29/621; 204/192 F; 219/216; 219/543;
427/126.2
[58] Field of Search ................. 427/103, 126; 29/611,
29/620, 621; 219/543, 216; 204/192 F

[56] References Cited

U.S. PATENT DOCUMENTS

| | | | |
|---|---|---|---|
| 3,825,722 | 7/1974 | Taniguchi | 219/216 |
| 3,903,393 | 9/1975 | Wesley | 29/611 |
| 4,007,352 | 2/1976 | Ura | 29/611 |
| 4,017,712 | 4/1977 | Baraff | 29/611 |
| 4,031,272 | 6/1977 | Khanna | 29/620 |

Primary Examiner—John D. Smith
Attorney, Agent, or Firm—Sughrue, Rothwell, Mion, Zinn and Macpeak

[57] ABSTRACT

A thermal printing head having a heating resistor prepared according to a thin-film technique and a wiring circuit prepared according to a thick-film technique achieves a high printing quality at a low cost. A thin-film resistor is formed on a heat-insulating dielectric layer which is, in turn, provided partially on a dielectric substrate, while thick-film lead electrodes, which are connected to a driving circuit, are formed on the dielectric substrate so as to make contact with the edge portion of the heat-insulating dielectric layer. Thin-film lead electrodes electrically connect the thick-film lead electrodes to the opposite ends of the thin-film resistor. The heat-insulating dielectric layer and the thick-film lead electrodes are provided by means of thick-film technique such as screen-printing and succeeding firing processes and the thin-film resistor and the thin-film lead electrodes are formed through thin-film technique such as sputtering or vacuum-evaporating process.

4 Claims, 6 Drawing Figures

METHOD OF MANUFACTURING AN INTEGRATED THERMAL PRINTING HEAD

This invention relates to a thermal printing head and a manufacturing method thereof and more particularly to an integrated thermal printing head arrangement for a heat-sensitive recording apparatus suitable to facsimile recording.

Recently, a heat-sensitive recording system has found a wide application in facsimile apparatus, because of many advantages, such as good cost performance as a recording head, a compact size of the arrangement, simplicity in handling, and low running cost, over those of a conventional type recording system. Thus, the facsimile apparatus employing the aforenoted system have achieved a wide practical application in every aspect of industries.

According to the heat-sensitive system, there is used a thermal printing head including a plurality of heating resistors arranged, ordinarily, along a line on an insulating substrate, their lead electrodes, and a protective layer covering the lead electrodes and the heating resistors for protecting them from abrasion. In operation, a recording signal current is supplied via the lead electrodes to the heating resistors and the Joule's heat generated from the resistor is supplied to the heat sensitive recording sheet, thereby developing a color for recording same on the sheet.

The types of the thermal printing heads are classified, depending on the types of materials of heating resistors and the processes for manufacturing the printing heads, into (i) a thick-film type, which is disclosed, for example, in the specification of U.S. Pat. No. 3,903,393 published on Sept. 2, 1975, (ii) a thin-film type as disclosed in U.S. Pat. No. 4,007,352 published on Feb. 8, 1977, and (iii) a semiconductor type. The former two types are deemed as being important from a viewpoint of practical application.

A distinction between the thick-film type and a thin-film type is drawn by a process of manufacture rather than the thickness of films formed. Thick-film type elements such as "thick-film lead electrode" are those which are prepared by printing a material for the element such as an electrically conductive material for electrode in a paste-like form in a desired pattern and subjected to a firing process so as to fix the paste on a substrate. Thin-film type elements such as "thin-film reistors" and "thin-film lead electrodes" are those formed by a vacuum deposition technique such as vacuum evaporation or sputtering.

The requirements for the thermal printing head are (i) a less variation in reistance at a low consumption of electric power and a high resolution, in the aspect of the performance thereof. Meanwhile, a low manufacturing cost is one of the important requirements.

However, the thick-film type and thin-film type heads are incompatible in terms of the relationship between performance and cost. More particularly, the thick-film type heads are attained by low manufacturing cost but inferior in performance. A conventional thin-film thermal printing heads affords a high performance because of the feasibility of formation of a fine pattern according to its nature of the manufacturing process, while the manufacture thereof dictates an expenditure of much effort, and hence the aforenoted thin-film thermal heads are costly.

It is accordingly an object of the present invention to provide a novel arrangement of a thermal printing head which affords a high cost performance and a manufacturing method thereof.

It is another object of the present invention to provide an integrated thermal printing head which allows the less expensive formation of a complex wiring circuit, and provides a high printing quality for heating resistor.

According to one aspect of the present invention, the arrangement of a heating resistive portion is such that thick-film lead electrodes spaced a distance from one another in opposed relation are provided over an insulating substrate, while spaces among the opposed lead electrodes are filled with a heat-insulating glass layer having a flat top surface. Formed over the glass layer are a thin-film resistor. There is provided thin-film lead electrodes for electrically connecting the thin-film resistor to thick-film lead electrodes. Superposed on the top surface of the heating resistor portions having the aforenoted arrangement are an oxidation-preventive film and then a protective layer in the order from below to upwards.

The heat-insulating glass layer and thick-film lead electrodes are provided by screen-printing and firing processes. On the other hand, the thin-film resistor, the thin-film lead electrodes, the oxidation-preventive film and the protective layer are formed by means of sputtering or vacuum-evaporating process.

According to another aspect of the present invention, thick-film lead electrodes and a heat-insulating glass layer as disclosed in the preceding embodiment, are provided over an insulating substrate through the medium of another heat-insulating glass layer, thereby minimizing the thickness of the heat-insulating glass layer supporting the thin-film resistor.

In addition, with the thermal printing head including a plurality of heating resistor portions having the aforenoted arrangement, there are formed thin-film connecting electrodes so as to reduce an array spacing among thin-film resistors, as compared with an array spacing among thick-film lead electrodes, and matrix wiring circuits consisting of thick-film lead electrodes are formed on the one side of the substrate.

Other objects and advantages of the present invention will be apparent from the detailed description of preferred embodiments thereof and from the attached drawings of which:

Figure 1:
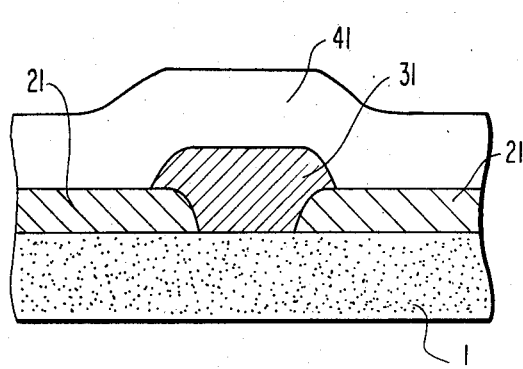
FIG. 1 is a longitudinal cross-sectional view of a single heating resistor portion for a conventional thick-film thermal printing head.

Acccording to the conventional thick-film thermal printing head as shown in FIG. 1, thick-film lead electrodes 21 are formed on a dielectric substrate 1 such as alumina, while a thick-film resistor 31 is formed between the electrodes 21,21, thus serving as a heating resistor. A thick-film glass layer 41 is formed over the entire, top surface of the resistor 31 as a protective layer against abrasion. The thermal printing head has several hundreds to several thousands of resistors arranged in row or matrix form on a substrate and connected to respective driving circuits. A considerably large sized thick-film integrated thermal printing head may be manufactured by relatively simple technique and manufacturing equipment, thus providing adaptability to mass producibility, and hence a low manufacturing cost. However, a fine pattern of lead electrodes and heating resistors is not easily obtained and it is difficult to print with high resolution more than 6 to 7 lines per millimeter. At present, the uniformity and stability are not sufficient due to a wide variation of resistance values among thick-film resistors. In addition, thick-film printing heads use a substrate that has a relatively high thermal conductivity, such as alumina ceramic, because of its manufacture including a firing step at a high temperature, thus causing a high proportion of available heat to be wasted and not transferred to a thermally sensitive paper.

Figure 2:
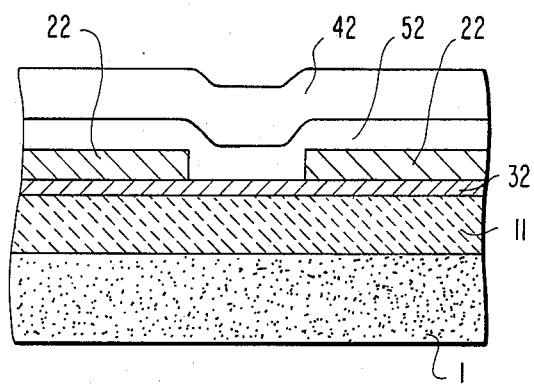
FIG. 2 is a longitudinal cross-sectional view of single heating resistor portion for a conventional thin-film thermal printing head.

As shown in FIG. 2, according to a thin-film thermal printing head, a glazed layer 11 is formed over the entire surface of a ceramic substrate 1, and then a thin-film resistor 32 and lead electrodes 22 are formed thereon. In addition, an oxidation-preventive film 52 and a protective layer 42 are in turn formed on the thin-film resistor 32. The glazed layer 11 is made of glass having low thermal conductivity, thereby serving as a heat insulating layer. Accordingly, the thermal efficiency is greatly improved. In addition, the glazed layer 11 having a low softening point provides a smooth surface, thereby easily providing an extremely fine pattern of resistor 32 and lead electrodes 22, with an accompanying improved resolution, and uniformity due to a minimized variation in resistance of the thin-film resistors. These advantages contribute to a high printing quality. However, the thin-film thermal printing head needs a relatively sophisticated technique, such as vacuum evaporation, sputtering, photo-etching and the like, thus raising a difficulty in that manufacture of a large sized printing head as well as in mass production. Accordingly, an essential advantage of a low cost required for a home market is hard to attain.

Figure 3A:
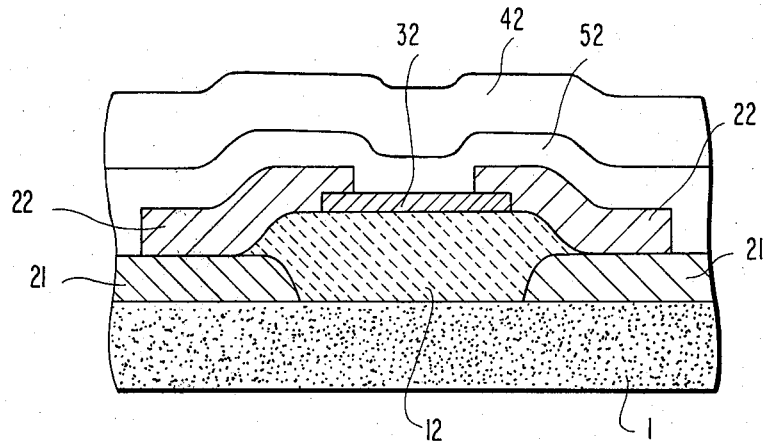
FIG. 3A is a longitudinal cross-sectional view of a single heating resistor portion according to the first embodiment of the invention.
Figure 3B:
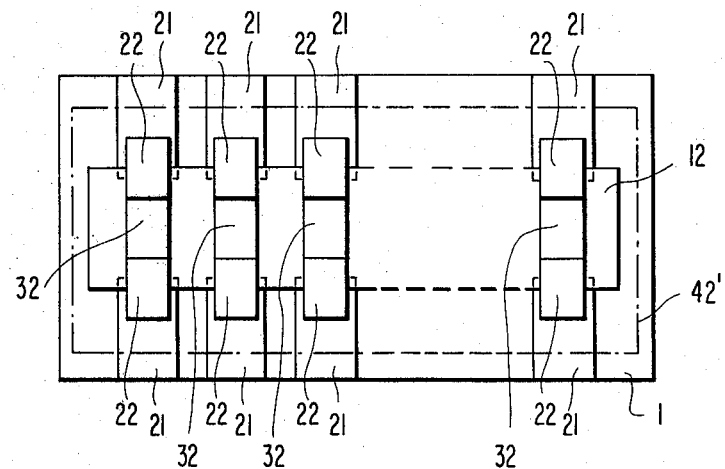
FIG. 3B is a plan view showing a row arrangement of a plurality of heating resistor portions having an arrangement as shown in FIG. 3A.

According to the embodiment as shown in FIG. 3A, thick-film lead electrodes 21 such as shown in FIG. 1 are formed over the surface of a dielectric substrate 1, and then a heat-insulating dielectric layer 12 is formed between the thick-film lead electrodes 21 which are positioned in opposed relation, after which a thin-film resistor 32, thin-film lead electrodes 22, an oxidation-preventive film 52 for the thin-film resistor, and then a protective layer 42 against abrasion are laminated in the order. Referring to FIG. 3B, a one-point chain line 42' represents a region, over which the oxidation preventive film 52 and protective layer 42 are formed. The thick-film lead electrodes 21 are further extended on the same dielectric substrate 1, thereby forming common leads for matrix circuits (not shown), separated diode electrodes, and driving circuits such as crossovers. The thin-film resistor 32 is made generally of a tantalum nitride ($Ta_2N$), nickel chromium alloy or the like having a thickness on the order of 0.1 microns. The thin-film lead electrode 22 in general is made of a highly electrically conductive material, such as gold or platinum having a thickness on the order of 0.5 micron to several microns, and provided in the form of one or more layers. For improving bonding forces among the resistors 32, heat-insulating dielectric layer 12 and thick-film lead electrodes 22, although not shown, thin-films as thin as about 0.1 micron, which are selected from chromium, nickel-chromium alloy, nickel, titanium, molybdenum or the like, are provided as underlayers or toplayers of the aforenoted thin-film good conductors. The oxidation preventive film 52 is made of $SiO_2$, $Al_2O_3$ or the like, depositied to a thickness of several microns. The protective, or wear resistant, layer 42 is made of $Ta_2O_5$, $Al_2O_3$ or the like having a thickness of about 10 microns. The thin-film portions are manufactured according to a conventional manufacturing technique for thin-film integrated circuits, including deposition of a thin-film by diode sputtering, radio frequency sputtering, vacuum evaporation, or metal plating and patterning of the deposited thin-film by photo-etching, lift-off method, or the like.

The heat-insulating dielectric layer 12 in general is made of non-alkali or alkali thick-film glass having a thickness of about 20 to 100 microns. $Ta_2O_5$ film (not shown) may be coated over the surface of the dielectric layer 12. Instead of thick-film glass, $Ta_2O_5$ film, $Al_2O_3$ film or $SiO_2$ film having sufficient thickness can be used. The thick-film lead electrodes 21 are made of a good conductive material, having a thickness of several microns, such as of gold, gold-palladium, silver-platinum, silver, silver-palladium and the like. A thick-film pattern can be easily obtained by a conventional thick-film integrated circuit technique such that a paste material is screen-printed and then fired.

According to one embodiment of the present invention, as shown in FIGS. 3A and 3B, a thin-film resistor 32 is formed over the heat-insulating dielectric layer 12, i.e., a glazed layer. Accordingly, like the thin-film thermal printing head shown in FIG. 2, the thermal printing head according to this embodiment provides good thermal efficiency and thermal response, as well as less variation in resistance, thereby providing heating resistors having a good resolution. Meanwhile, it is needless to say that the thin-film resistor 32 may be provided all over the heat-insulating layer 12 as well as thick-film lead electrodes 21.

Meanwhile, electrode lead portions consistitute a complicated driving circuit. However, since this circuit is formed by extending the thick-film lead electrode 21 a desired distance, the driving circuit is easily formed at a low cost, and allowing the manufacture of a large sized printing head having high mechanical strength and the like, which are the advantages of the thick-film thermal printing head as shown in FIG. 1. Accordingly, the present invention may provide thermal printing heads for use in facsimiles adapted to a home market.

Figure 4:
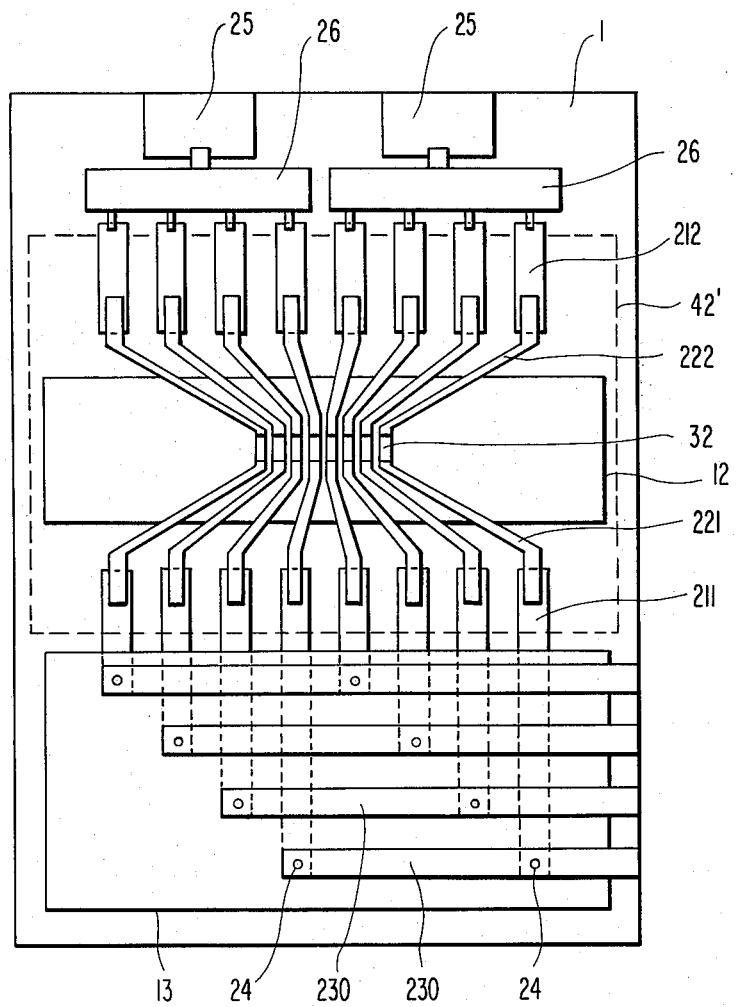
FIG. 4 is a plan view showing an embodiment of the integrated thermal printing head according to the present invention.

Description will be turned to the second embodiment of the present invention with reference to FIG. 4, in which further improved advantages of the present invention are exhibited.

Like the first embodiment, a pair of thick-film lead electrode arrays 211 and 212, a pair of thin-film lead electrode arrays 221 and 222, heat-insulating dielectric layer 12, oxidation preventive film and wear resistant layer (not shown, except for its position shown by a broken line 42') are formed on the dielectric substrate 1. The thick-film lead electrodes 211 extended so as to be sandwitched between the substrate 1 and a crossover dielectric layer 13, and electrically connected to thick-film lead electrodes 230 secured on top surface of the crossover dielectric layer 13 by means of through-holes 24 formed therein. On the other hand, the thick-film lead electrodes 212 are extended so as to connect with thick-film common electrodes 25 through isolating diode arrays 26, both being also secured on the substrate 1. According to this embodiment, the sizes of thin-film lead electrodes 22 and thin-film resistors 32 are smaller than those in the thick-film portion. A resolution of the thick-film portion is limited to 6 to 7 lines/mm at the most. However, the thin-film portion provides a resolution as high as 20 lines/mm. This reveals that much improvement in resolution has been achieved in this embodiment, as compared with those achieved according to the first embodiment of the invention. For simplicity of explanation, eight heating resistors are shown in the form of 2×4 matrixes. It is apparent that, like this embodiment, 1000 to 2000 and over resistors having resolution of over 10 lines/mm may be provided for providing an integrated thermal printing head for use with A6 and A4 sizes. In FIG. 4, the width of the heat-insulating layer 12 is smaller than the distance between the thick-film lead electrodes 211 and 212 provided in opposed relation. However, it is preferable that the heat-insulating layer 12 be overlapped as shown in FIGS. 3A and 3B.

The partial provision of an integrated thin-film portion and thick-film portion as given in this embodiment may provide much improved advantages, as compared with a combined type of the thin-film and thick-film portions. In other words, the connections of circuits may be provided, merely according to an integrated circuit producing technique, thereby improving the reliability of the thermal printing head. In addition, when the crossover dielectric layer 13 and heat-insulating layer 12 are formed of the same material, the manufacturing process may be much simplified.

Figure 5:
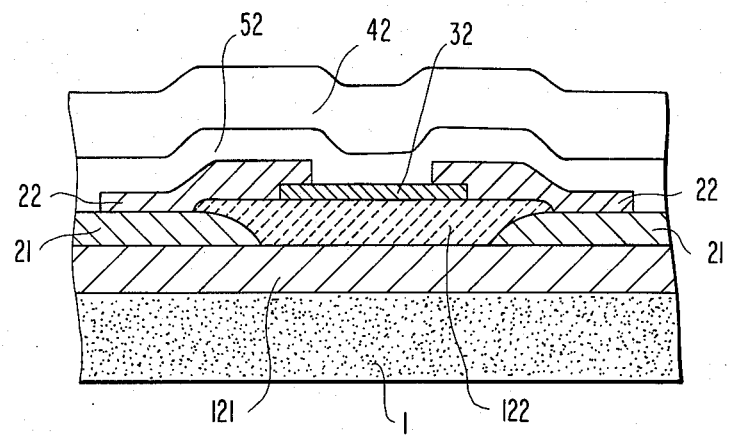
FIG. 5 is a cross-sectional view showing an improved embodiment of that shown in FIG. 3A.

FIG. 5 shows another embodiment of the invention, which is an improvement over the embodiment shown in FIG. 3A.

According to this embodiment, glass ceramic paste is screen-printed over the entire surface of an insulating substrate made of such as alumina ceramic to a thickness of 40 to 50 microns, followed by firing at a temperature higher than the softening point of the glass ceramic (about 900° C.–950° C.) to provide a first heat-insulating layer 121. In addition, a gold paste or the like is screen-printed over the first heat-insulating layer 121, followed by firing at a high temperature of about 900° C. or less, thereby forming opposed thick-film lead electrodes 21. The thickness of the first heat-insulating layer 121 ranges from 40 to 50 microns, although it appears that a thin-film resistor 32 may be provided over the surface of the layer 121. However, since the first heat-insulating layer 121 is made of glass ceramic so as to withstand the firing for the thick-film lead electrodes 21, the surface roughness of the layer 121 is on the order of 5 microns due to the properties inherent to crystallized glass, i.e., the roughness of the layer 121 is about 100 times as large as that of the thickness of the thin-film resistor 32 as has been used in the practical application, so that it is impossible to lay the heating resistor 32 directly over the surface of the layer 121. Accordingly, for the dual purposes of smoothening the surface of the layer 121, on which the thin-film resistor 32 to be laid, and improving a heat-insulating function thereof, the glass paste having a softening point of about 500°–600° C. is screen-printed between the opposed thick-film lead electrodes 21 to a thickness of about 10 microns, and then softened at a high temperature of about 800° C. or less, thereby providing a second heat-insulating layer 122 having a smooth surface.

In case the cross-over dielectric layer 13 shown in FIG. 4 is made of the same material as that of the second heat-insulating layer 122, a manufacturing process for the thermal printing head be much simplified. Thereafter, the process follows the same steps for the embodiment shown in FIG. 3, in a manner that thin-film heating resistors 32, thin-film lead electrodes 22, oxidation preventive layer 52 and protective (wear-resistant) layer 42 are formed in that order.

When the heat-insulating layer 12 shown in FIG. 3A becomes about 60 microns thick, then there sometimes arises a problem of the failure to accurately form a photo-resist pattern during the step of forming thin-film lead electrodes 22 in a portion along the sloped edge of the heat-insulating layer 12. More specifically, the conventional photoresist coating process is carried out by blowing away excessive photoresist according to a centrifugal force created in a rotary coating means. However, in case there are a large area of sloped edges on the heat-insulating layer 12, then the sloped edge portions are likely to be coated with a photoresist film having a thickness of several times as large as that of the other portions thereof. Accordingly, in case the resist on the aforenoted sloped edge portion is desired to be developed completely, then the desired portions tend to be subjected to over-exposure, thereby failing to achieve a normal pattern with a high accuracy.

This problem stems from an excessive thickness of the heat-insulating layer 12, so that this problem appears to be able to be solved by reducing the thickness thereof. However, this leads to lowered heat utilization which is incompatible with the aformentioned requirement. Meanwhile, according to the embodiment shown in FIG. 5, the thickness of the second heat-insulating layer 122 is as small as about 10 microns, which is much smaller in thickness, as compared with that of the heat-insulating layer 12 shown in FIG. 3, thus causing no problem occuring from the aforenoted increased thickness, and yet, the thickness of the first heat-insulating layer 121 is on the order of 40 to 50 microns, thereby eliminating the lowered thermal efficiency.

Stated differently, the thermal printing head according to the embodiment shown in FIG. 5 may solve the problem in the manufacture of the embodiment shown in FIG. 3A by dividing the heat-insulating layer into two portions, while affording a combination of the advantages which may be derived from the thin-film-and thick-film thermal-printing-head manufacturing technique. This contributes to the improvements in printing quality and low consumption of electric power, i.e., improvements in a cost performance characteristic of an integrated thermal printing head.

Although the present invention has been described with respect to specific details of certain embodiments thereof, it is not intended that such details be limitations upon the scope of the invention except insofar as set forth in the following claims.

What is claimed is:

1. A process for manufacturing a thermal printing head comprising the steps of: screen-printing in a given pattern an electrically conductive paste over the surface of a dielectric substrate, firing the printed conductive paste to form two or more opposed thick-film lead electrodes over said substrate, screen-printing a dielectric paste between said opposed lead electrodes, firing the printed dielectric paste to form heat-insulating dielectric layer having flat top surface, forming a thin-film resistive layer on a region of the surface of said dielectric layer, forming thin-film electrically conductive members in a manner that said resistive layer be electrically connected to said thick-film lead electrodes, and forming a dielectric protective film over said resistive layer.

2. A process for manufacturing a thermal printing head as set forth in claim 1, further comprising the steps of screen-printing another dielectric paste on the surface of said substrate prior to said screen-printing of thick-film lead electrodes, and firing said another dielectric paste to form an additional heat-insulating dielectric layer having a softening point higher than the firing temperature of said thick-film lead electrodes.

3. The process of claim 1, in which said steps of forming a thin-film resistive layer, forming thin-film electrically conductive members, and forming a dielectric protective film respectively include sputtering or vacuum-evaporation process.

4. The process of claim 1, in which said step of forming a thin-film resistive layer includes depositing a layer of a resistive material by sputtering or evaporation and selectively removing said layer of the resistive material to form a desired pattern of said thin-film resistive layer.

* * * * *

UNITED STATES PATENT AND TRADEMARK OFFICE
CERTIFICATE OF CORRECTION

PATENT NO. : 4,241,103
DATED : December 23, 1980
INVENTOR(S) : OHKUBO et al.

It is certified that error appears in the above—identified patent and that said Letters Patent is hereby corrected as shown below:

Column 1, line 63, delete "heads" and insert -- head -- .

Column 2, line 17, delete "are" and insert -- is -- ;

line 17, delete "is" and insert -- are -- .

Column 3, line 44, delete "that" and insert -- the -- .

Column 4, line 11, delete "depositied" and insert -- deposited -- ;

line 46, delete "consistitute" and insert -- constitute -- .

Column 6, line 8, after "head" insert -- can -- .

Signed and Sealed this

Fourteenth Day of April 1981

[SEAL]

Attest:

RENE D. TEGTMEYER

Attesting Officer     Acting Commissioner of Patents and Trademarks